US012162294B2

(12) United States Patent
Altman et al.

(10) Patent No.: US 12,162,294 B2
(45) Date of Patent: Dec. 10, 2024

(54) LIFT PRINTING USING THIN DONOR FOILS

(71) Applicant: Orbotech Ltd., Yavne (IL)

(72) Inventors: Marc Altman, Rehovot (IL); Zvi Kotler, Tel Aviv (IL); Itay Peled, Jerusalem (IL); Oleg Ermak, Netanya (IL); Sharona Cohen, Nof Ayelon (IL)

(*) Notice: Subject to any disclaimer, the term of this patent is extended or adjusted under 35 U.S.C. 154(b) by 510 days.

(21) Appl. No.: 17/427,372

(22) PCT Filed: May 4, 2020

(86) PCT No.: PCT/IL2020/050491
§ 371 (c)(1),
(2) Date: Jul. 30, 2021

(87) PCT Pub. No.: WO2020/225810
PCT Pub. Date: Nov. 12, 2020

(65) Prior Publication Data
US 2022/0024223 A1 Jan. 27, 2022

Related U.S. Application Data

(60) Provisional application No. 62/844,150, filed on May 7, 2019.

(51) Int. Cl.
*B41J 2/455* (2006.01)
*B41J 2/435* (2006.01)
(Continued)

(52) U.S. Cl.
CPC .............. *B41J 2/455* (2013.01); *B41J 2/435* (2013.01); *B41J 2/442* (2013.01); *B41J 2/47* (2013.01);
(Continued)

(58) Field of Classification Search
CPC ... B41J 2/455; B41J 2/435; B41J 2/442; B41J 2/47; B41J 33/14; H05K 3/1275;
(Continued)

(56) References Cited

U.S. PATENT DOCUMENTS

| 4,895,735 A | 1/1990 | Cook |
| 5,644,353 A | 7/1997 | Sarraf |

(Continued)

FOREIGN PATENT DOCUMENTS

| WO | 2016116921 A1 | 7/2016 | |
| WO | WO-2017006306 A1 * | 1/2017 | ......... B23K 26/0604 |

OTHER PUBLICATIONS

WIPO, International Search Report for PCT/IL2020/050491, Aug. 3, 2020.

*Primary Examiner* — Henok D Legesse
(74) *Attorney, Agent, or Firm* — Hodgson Russ LLP

(57) ABSTRACT

Printing apparatus includes a donor supply assembly, which positions a transparent donor substrate having opposing first and second surfaces and a donor film formed on the second surface so that the donor film is in proximity to a target area on an acceptor substrate. An optical assembly directs one or more beams of laser radiation to pass through the first surface of the donor substrate and impinge on the donor film so as to induce ejection of material from the donor film onto the acceptor substrate. Means are provided to mitigate or compensate for the variation in reflection of the laser radiation across an area of the donor substrate, so as to equalize a flux of the laser radiation that is absorbed in the donor film across the area of the donor substrate.

23 Claims, 9 Drawing Sheets

(51) Int. Cl.
*B41J 2/44* (2006.01)
*B41J 2/47* (2006.01)
*B41J 33/14* (2006.01)
*H05K 3/12* (2006.01)

(52) U.S. Cl.
CPC ............ *B41J 33/14* (2013.01); *H05K 3/1275* (2013.01); *H05K 2203/108* (2013.01)

(58) Field of Classification Search
CPC ....... H05K 2203/108; H05K 2203/107; H10K 71/18; C23C 14/14; C23C 14/246; C23C 14/28; C23C 14/543; C23C 14/048
See application file for complete search history.

(56) References Cited

U.S. PATENT DOCUMENTS

| | | |
|---|---|---|
| 8,395,083 B2 | 3/2013 | Naveh et al. |
| 9,925,797 B2 | 3/2018 | Kotler et al. |
| 2007/0082288 A1 | 4/2007 | Wright et al. |
| 2009/0061112 A1 | 3/2009 | Kirmeier |
| 2010/0227133 A1 | 9/2010 | Liu et al. |
| 2017/0306495 A1 | 10/2017 | Kotler et al. |

\* cited by examiner

LIFT PRINTING USING THIN DONOR FOILS

FIELD OF THE INVENTION

The present invention relates generally to laser-induced material transfer, and particularly to methods and apparatus for printing of material from a donor substrate onto an acceptor substrate.

BACKGROUND

In laser direct-write (LDW) techniques, a laser beam is used to create a patterned surface with spatially-resolved three-dimensional structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier substrate before the photons are absorbed by the inner surface of the film. Above a certain energy threshold, material is ejected from the donor film toward the surface of the acceptor substrate. Given a proper choice of donor film and laser beam pulse parameters, the laser pulses cause molten droplets of the donor material to be ejected from the film, and then to land and harden on the acceptor substrate.

Some LIFT printing systems use thin, flexible donor substrates. For example, U.S. Pat. No. 9,925,797, whose disclosure is incorporated herein by reference, describes printing apparatus, including a donor supply assembly, which is configured to provide a transparent donor substrate having opposing first and second surfaces and a donor film formed on the second surface so as to position the donor film in proximity to a target area on an acceptor substrate. An optical assembly is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

In most LIFT systems, the donor film is held parallel to the acceptor substrate. PCT International Publication WO 2016/116921, whose disclosure is incorporated herein by reference, describes an apparatus for material deposition on an acceptor surface that differs from this usual model. The apparatus includes a transparent donor substrate having opposing first and second surfaces, such that at least a part of the second surface is not parallel to the acceptor surface, and includes a donor film on the second surface. The apparatus additionally includes an optical assembly, which is configured to direct a beam of radiation to pass through the first surface of the donor substrate and impinge on the donor film at a location on the part of the second surface that is not parallel to the acceptor surface, so as to induce ejection of droplets of molten material from the donor film onto the acceptor surface.

SUMMARY

Embodiments of the present invention that are described hereinbelow provide LIFT printing systems and methods with enhanced print quality.

There is therefore provided, in accordance with an embodiment of the invention, printing apparatus, including a donor supply assembly, which is configured to position a transparent donor substrate having opposing first and second surfaces and a donor film formed on the second surface so that the donor film is in proximity to a target area on an acceptor substrate. An optical assembly is configured to direct one or more beams of laser radiation to pass through the first surface of the donor substrate and impinge on the donor film so as to induce ejection of material from the donor film onto the acceptor substrate. A monitoring assembly is configured to measure a variation in reflection of the laser radiation across an area of the donor substrate. A controller is configured to adjust an intensity of the laser radiation responsively to the measured variation so as to equalize a flux of the laser radiation that is absorbed in the donor film across the area of the donor substrate.

In some embodiments, the monitoring assembly is configured to capture an image of an interference pattern formed by the laser radiation, wherein the interference pattern is indicative of the variation in the reflection.

In a disclosed embodiment, the donor film includes a metal, and the donor substrate has a thickness between the first and second surfaces that is no greater than 200 µm.

Additionally or alternatively, the donor substrate is included in a continuous flexible foil, and the donor supply assembly includes feed rollers, which are configured to feed the foil across the target area. In a disclosed embodiment, the donor supply assembly is configured to successively position different donor areas of the foil in proximity to the acceptor substrate, and the monitoring assembly is configured to measure the variation of the reflection respectively in each of the donor areas, and the controller is configured to adjust the intensity of the laser radiation impinging on each of the donor areas responsively to the respectively measured variation.

There is also provided, in accordance with an embodiment of the invention, printing apparatus, including a donor supply assembly, which is configured to position a transparent donor substrate having opposing first and second surfaces and a thickness between the first and second surfaces no greater than 200 µm, and having a donor film formed on the second surface so that the donor film is in proximity to a target area on an acceptor substrate. An optical assembly is configured to direct one or more beams of pulsed visible laser radiation, having a bandwidth of at least 0.8 nm, to pass through the first surface of the donor substrate and impinge on the donor film so as to induce ejection of material from the donor film onto the acceptor substrate.

In some embodiments, the pulsed laser radiation includes pulses having a pulse duration of at least 0.5 ns. Additionally or alternatively, the bandwidth of the visible laser radiation directed to pass through the first surface of the donor substrate is no greater than 1.0 nm.

In some embodiments, the optical assembly includes a laser, which generates an input beam of the laser radiation having an initial bandwidth less than 0.4 nm, and a nonlinear optical element, which is configured to receive and broaden the bandwidth of the input beam to at least 0.8 nm. The nonlinear optical element may be configured to broaden the bandwidth using the optical Kerr effect. Additionally or alternatively, the nonlinear optical element includes a doped optical fiber.

There is additionally provided, in accordance with an embodiment of the invention, printing apparatus, including a donor supply assembly, which is configured to position a transparent donor substrate having opposing first and second surfaces and a donor film formed on the second surface so that the donor film is in proximity to a target area on an acceptor substrate. An optical assembly includes a laser, which generates an input beam of laser radiation having an initial bandwidth, and a nonlinear optical element, which is configured to receive the input beam and generate an output beam having an output bandwidth at least twice the initial bandwidth. Optics are configured to direct the output beam to pass through the first surface of the donor substrate and impinge on the donor film so as to induce ejection of material from the donor film onto the acceptor substrate.

There is further provided, in accordance with an embodiment of the invention, printing apparatus, including a donor foil, which includes a transparent donor substrate having opposing first and second surfaces, a donor film formed on the second surface, and an anti-reflection coating formed on the first surface. A donor supply assembly is configured to position the donor foil so that the donor film is in proximity to a target area on an acceptor substrate. An optical assembly is configured to direct one or more beams of laser radiation to pass through the donor foil via the anti-reflection coating on the first surface of the donor substrate and impinge on the donor film so as to induce ejection of material from the donor film onto the acceptor substrate.

In a disclosed embodiment, the anti-reflection coating includes multiple thin-film layers.

There is moreover provided, in accordance with an embodiment of the invention, printing apparatus, including a donor foil, which includes a transparent donor substrate including a birefringent material having opposing first and second surfaces and a thickness between the first and second surfaces chosen so that the donor substrate behaves as a quarter-wave plate at a selected wavelength, and a donor film formed on the second surface. A donor supply assembly is configured to position the donor foil so that the donor film is in proximity to a target area on an acceptor substrate. An optical assembly is configured to direct one or more beams of laser radiation at the selected wavelength to pass through the donor foil and impinge on the donor film so as to induce ejection of material from the donor film onto the acceptor substrate.

There is furthermore provided, in accordance with an embodiment of the invention, printing apparatus including a film carrier, including a block of a transparent material having opposing first and second sides, which is positioned so that the second side is in proximity to a target area on an acceptor substrate. A donor supply assembly is configured to position a transparent donor substrate having opposing first and second surfaces and a donor film formed on the second surface so that the second surface of the donor substrate is in contact with the second side of the block of the transparent material and the donor film is in proximity to the target area on the acceptor substrate. An optical assembly is configured to direct one or more beams of pulsed laser radiation to pass through the first side of the block of the transparent material and through the donor substrate, and to impinge on the donor film so as to induce ejection of material from the donor film onto the acceptor substrate.

In a disclosed embodiment, the block of the transparent material and the donor substrate have respective indices of refraction that differ from one another by no more than 10% at a wavelength of the laser radiation. Additionally or alternatively, the second side of the block of the transparent material has a convex shape.

There is also provided, in accordance with an embodiment of the invention, printing apparatus, including a donor supply assembly, which is configured to position a transparent donor substrate having opposing, mutually-parallel first and second surfaces and a donor film formed on the second surface with the donor film in proximity and parallel to a target area on an acceptor substrate. An optical assembly is configured to direct one or more beams of laser radiation to pass through the first surface of the donor substrate at an angle that deviates from a normal to the first surface by at least 1°, and to impinge on the donor film so as to induce ejection of material from the donor film onto the acceptor substrate.

In some embodiments, the optical assembly is configured so that the angle at which the one or more beams of laser radiation pass through the first surface of the donor substrate deviates from the normal to the first surface by at least 5°, or possibly by 10°.

In a disclosed embodiment, the optical assembly includes a lens having an optical axis, and the one or more beams of laser radiation are incident on the lens off the optical axis, thereby causing the one or more beams to deviate from a normal to the first surface.

There is additionally provided, in accordance with an embodiment of the invention, printing apparatus, including a donor sheet, which includes a transparent donor substrate having opposing first and second planar surfaces, which are mutually non-parallel, and a donor film formed on the second planar surface. A donor supply assembly is configured to position the donor sheet so that the donor film is in proximity to a target area on an acceptor substrate. An optical assembly is configured to direct one or more beams of laser radiation to pass through the donor sheet and impinge on the donor film so as to induce ejection of material from the donor film onto the acceptor substrate.

In a disclosed embodiment, the first planar surface is wedged relative to the second planar surface by a wedge angle of at least 1°.

In one embodiment, the donor supply is configured to position the donor sheet so that the second planar surface is tilted relative to the acceptor substrate. Alternatively, the donor supply is configured to position the donor sheet so that the second planar surface is parallel to the acceptor substrate. In one such embodiment, the optical assembly is configured to direct the one or more beams of laser radiation to impinge on the first planar surface at an angle that is not normal to the first planar surface.

There is further provided, in accordance with an embodiment of the invention, printing apparatus, including a donor foil, which includes a transparent donor substrate having opposing first and second surfaces, at least one of which deviates sufficiently from flatness so that within a printable area of the donor foil, a thickness of the donor substrate varies by at least 10% over any given sector having transverse dimensions of at least 1 mm, and a donor film formed on the second surface. A donor supply assembly is configured to position the donor foil so that the donor film is in proximity to a target area on an acceptor substrate. An optical assembly is configured to direct one or more beams of laser radiation to pass through the printable area of the donor foil and impinge on the donor film so as to induce ejection of material from the donor film onto the acceptor substrate.

There is moreover provided, in accordance with an embodiment of the invention, printing apparatus, including a donor foil, which includes a transparent donor substrate having opposing first and second surfaces, wherein the second surface is roughened sufficiently to scatter at least 50% of radiation reflected from the second surface into angles greater than 5° relative to a normal to the second surface, and a donor film formed on the second surface. A donor supply assembly is configured to position the donor foil so that the donor film is in proximity to a target area on an acceptor substrate. An optical assembly is configured to direct one or more beams of laser radiation to pass through the printable area of the donor foil and impinge on the donor film so as to induce ejection of material from the donor film onto the acceptor substrate.

In some embodiments, the optical assembly is configured to focus the one or more beams of the laser radiation to impinge on the donor film with a selected spot size, and a lateral scale of a roughening of the second surface is less than half the spot size. Additionally or alternatively, the donor film has a predefined thickness, and a root mean square (RMS) roughness of the second surface is less than half the predefined thickness.

There is furthermore provided, in accordance with an embodiment of the invention, a method for printing, which includes positioning a transparent donor substrate having opposing first and second surfaces and a donor film formed on the second surface so that the donor film is in proximity to a target area on an acceptor substrate. One or more beams of laser radiation are directed to pass through the first surface of the donor substrate and impinge on the donor film so as to induce ejection of material from the donor film onto the acceptor substrate. A variation in reflection of the laser radiation is measured across an area of the donor substrate. An intensity of the laser radiation is adjusted responsively to the measured variation so as to equalize a flux of the laser radiation that is absorbed in the donor film across the area of the donor substrate.

There is also provided, in accordance with an embodiment of the invention, a method for printing, which includes positioning a transparent donor substrate having opposing first and second surfaces and a thickness between the first and second surfaces no greater than 200 µm, and having a donor film formed on the second surface so that the donor film is in proximity to a target area on an acceptor substrate. One or more beams of pulsed visible laser radiation, having a bandwidth of at least 0.8 nm, are directed to pass through the first surface of the donor substrate and impinge on the donor film so as to induce ejection of material from the donor film onto the acceptor substrate.

There is additionally provided, in accordance with an embodiment of the invention, a method for printing, which includes positioning a transparent donor substrate having opposing first and second surfaces and a donor film formed on the second surface so that the donor film is in proximity to a target area on an acceptor substrate. An input beam of laser radiation having an initial bandwidth is directed into a nonlinear optical element, which generates an output beam having an output bandwidth at least twice the initial bandwidth. The output beam is directed to pass through the first surface of the donor substrate and impinge on the donor film so as to induce ejection of material from the donor film onto the acceptor substrate.

There is further provided, in accordance with an embodiment of the invention, a method for printing, which includes providing a donor foil, including a transparent donor substrate having opposing first and second surfaces, a donor film formed on the second surface, and an anti-reflection coating formed on the first surface. The donor foil is positioned so that the donor film is in proximity to a target area on an acceptor substrate. One or more beams of laser radiation are directed to pass through the donor foil via the anti-reflection coating on the first surface of the donor substrate and impinge on the donor film so as to induce ejection of material from the donor film onto the acceptor substrate.

There is moreover provided, in accordance with an embodiment of the invention, a method for printing, which includes providing a donor foil, including a transparent donor substrate including a birefringent material having opposing first and second surfaces and a thickness between the first and second surfaces chosen so that the donor substrate behaves as a quarter-wave plate at a selected wavelength, and a donor film formed on the second surface. The donor foil is positioned so that the donor film is in proximity to a target area on an acceptor substrate. One or more beams of laser radiation at the selected wavelength are directed to pass through the donor foil and impinge on the donor film so as to induce ejection of material from the donor film onto the acceptor substrate.

There is furthermore provided, in accordance with an embodiment of the invention, a method for printing, which includes positioning a film carrier, including a block of a transparent material having opposing first and second sides, so that the second side is in proximity to a target area on an acceptor substrate. A transparent donor substrate having opposing first and second surfaces and a donor film formed on the second surface is positioned so that the second surface of the donor substrate is in contact with the second side of the block of the transparent material and the donor film is in proximity to the target area on the acceptor substrate. One or more beams of pulsed laser radiation are directed to pass through the first side of the block of the transparent material and through the donor substrate, and to impinge on the donor film so as to induce ejection of material from the donor film onto the acceptor substrate.

There is also provided, in accordance with an embodiment of the invention, a method for printing, which includes positioning a transparent donor substrate having opposing, mutually-parallel first and second surfaces and a donor film formed on the second surface with the donor film in proximity and parallel to a target area on an acceptor substrate. One or more beams of laser radiation are directed to pass through the first surface of the donor substrate at an angle that deviates from a normal to the first surface by at least 1°, and to impinge on the donor film so as to induce ejection of material from the donor film onto the acceptor substrate.

There is additionally provided, in accordance with an embodiment of the invention, a method for printing, which includes providing a donor sheet, including a transparent donor substrate having opposing first and second planar surfaces, which are mutually non-parallel, and a donor film formed on the second planar surface. The donor sheet is positioned so that the donor film is in proximity to a target area on an acceptor substrate. One or more beams of laser radiation are directed to pass through the donor sheet and impinge on the donor film so as to induce ejection of material from the donor film onto the acceptor substrate.

There is further provided, in accordance with an embodiment of the invention, a method for printing, which includes providing a donor foil, including a transparent donor substrate having opposing first and second surfaces, at least one of which deviates sufficiently from flatness so that within a printable area of the donor foil, a thickness of the donor substrate varies by at least 10% over any given sector having transverse dimensions of at least 1 mm, and a donor film formed on the second surface. The donor foil is positioned so that the donor film is in proximity to a target area on an acceptor substrate. One or more beams of laser radiation are directed to pass through the printable area of the donor foil and impinge on the donor film so as to induce ejection of material from the donor film onto the acceptor substrate.

There is moreover provided, in accordance with an embodiment of the invention, a method for printing, which includes providing a donor foil, including a transparent donor substrate having opposing first and second surfaces, wherein the second surface is roughened sufficiently to scatter at least 50% of radiation reflected from the second surface into angles greater than 5° relative to a normal to the second surface, and a donor film formed on the second surface. The donor foil is positioned so that the donor film is in proximity to a target area on an acceptor substrate. One or more beams of laser radiation are directed to pass through the printable area of the donor foil and impinge on the donor film so as to induce ejection of material from the donor film onto the acceptor substrate.

The present invention will be more fully understood from the following detailed description of the embodiments thereof, taken together with the drawings in which:

DETAILED DESCRIPTION OF EMBODIMENTS

Overview

The LIFT-based system described in the above-mentioned U.S. Pat. No. 9,925,797 is capable of printing patterns in a wide range of donor materials, on a wide variety of different substrates, with high throughput. In a disclosed embodiment, the donor substrate comprises a continuous flexible donor foil, which is fed over feed rollers across the target area and comprises, for example, a film of metal or rheological material, which is coated on one side of a transparent donor substrate. The optical assembly in the system comprises a laser, which emits a single input beam, and optics that split the single input beam into the multiple output beams and direct (or "steer") the output beams toward the target area in accordance with predefined spatial patterns.

The volumes of the molten droplets ejected from the donor film in LIFT printing systems of this sort are determined by the energy, duration, and focused spot size of the laser pulses that are incident on the donor film. In general, it is desirable that the volumes of the droplet volumes be as uniform as possible, in order to ensure that the desired patterns are written on the acceptor substrate with well-controlled line-widths and thickness. In working with such systems, however, the present inventors discovered substantial variations in droplet volume, which they were able to trace to variations in the absorption of laser energy in the donor film as the result of interference effects within the donor foil. More specifically, variations in interference between reflections of the laser beam from different surfaces within the donor substrate—due to varying substrate thickness and internal inhomogeneities—cause large variations in the fraction of the laser energy that is absorbed at different locations in the film, with concomitant variations in the droplet temperature and volume. Such variations in droplet temperature can have critical effects, particularly in applications with high sensitivity to the electrical behavior of printed patterns.

Embodiments of the present invention that are described herein address this problem using a variety of different measures. These measures are applicable to various sorts of donor sheets, including both flexible donor foils and donor sheets that are based on more rigid substrates. The disclosed measures include modifications both in the donor sheet itself and in the application of the laser beam to the donor sheet, and they may be used individually or in substantially any combination. They share the property of mitigating the interference, so that the amount of laser energy absorbed at all locations in the donor film is substantially uniform, and the temperatures and volumes of the ejected droplets are thus uniform, as well.

System Description

Figure 1:
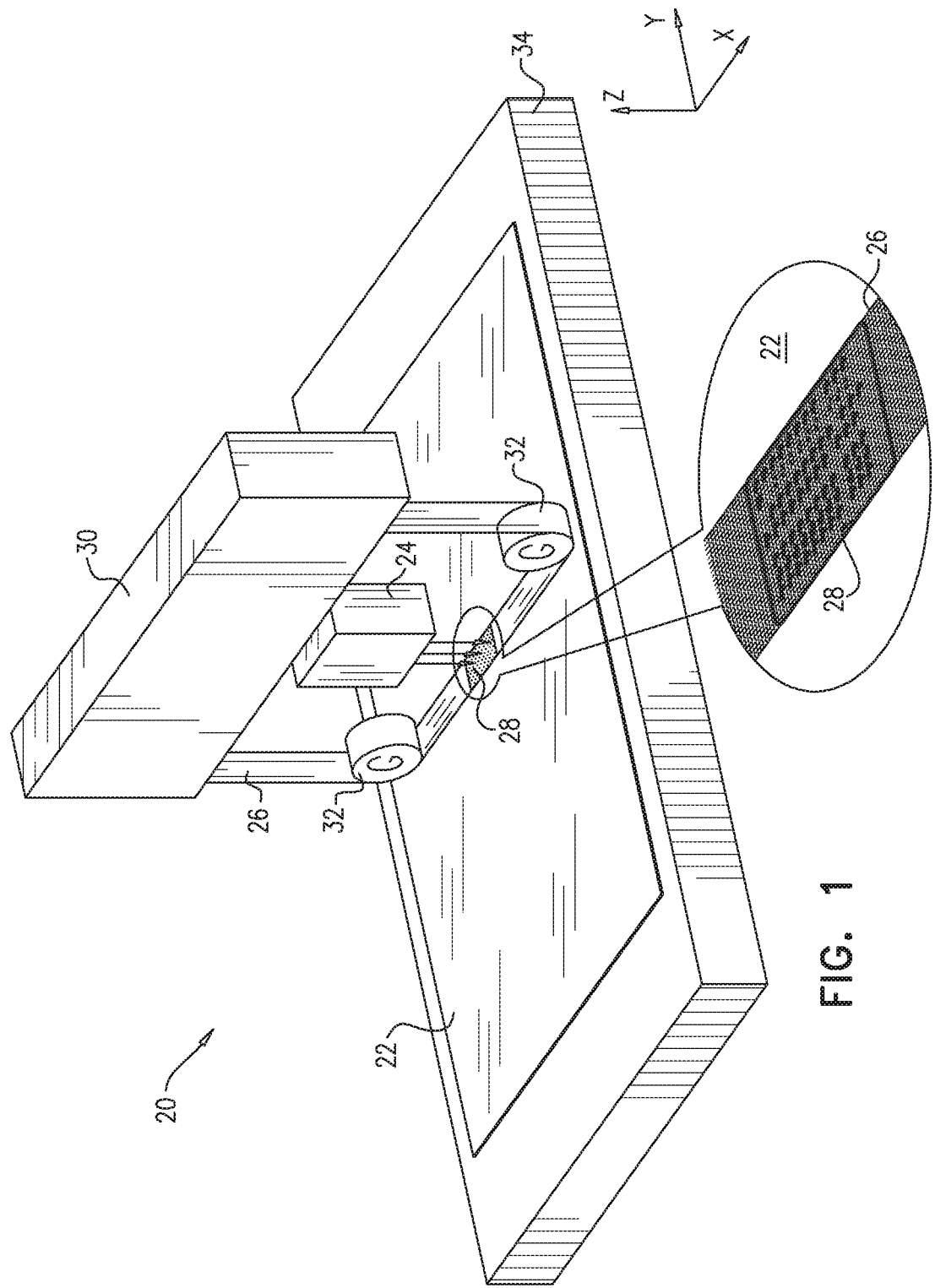
FIG. 1 is schematic, pictorial illustration of a LIFT printing system, in accordance with an embodiment of the present invention.

FIG. 1 is schematic, pictorial illustration of a LIFT printing system 20, in accordance with an embodiment of the present invention. System 20 comprises an optical assembly 24, which writes predefined patterns on an acceptor substrate 22 by laser-induced material transfer from a continuous, transparent donor foil 26. As described below in greater detail, donor foil 26 comprises a thin, flexible sheet of a transparent donor substrate, which is coated on the side facing the acceptor substrate with a donor film. Alternatively, the donor substrate may comprise a rigid or semi-rigid material. Acceptor substrate 22 may comprise any suitable material, such as glass, ceramic, or plastic, as well as other dielectric, semiconducting, or even conductive materials.

A donor supply assembly 30 positions a printable area of donor foil 26 in proximity to a target area 28 on acceptor substrate 22. The donor film (as shown in the figures that follow) is formed on the lower surface of at least the printable area of the donor foil. In the pictured example, feed rollers 32 advance and hold donor foil 26 in the desired position. Alternatively, donor supply assembly may comprise other sorts of positioning mechanisms, such as a linear positioning stage.

Optical assembly 24 directs one or more output beams of laser radiation in a predefined spatial pattern to pass through the upper surface of donor foil 26 and thus impinge on the donor film on the lower surface. The laser is typically controlled to output a train of pulses of a suitable wavelength, duration and energy so as to induce ejection of material from the donor film onto acceptor substrate 22. The choice of laser beam parameters depends, inter alia, on the composition and thickness of the donor film. By sweeping the beam or beams across target area 28 and controlling which beams to pulse at each location, optical assembly 24 is able to write substantially any suitable pattern onto the target area of the acceptor substrate.

System 20 also comprises a positioning assembly, which may comprise an X-Y stage 34, for example, on which acceptor substrate 22 is mounted. Stage 34 shifts acceptor substrate 22 relative to optical assembly 24 and donor supply assembly 30 to enable system 20 to write spatial patterns on different target areas 28 over the surface of the acceptor substrate. Additionally or alternatively, the positioning assembly may comprise motion components (not shown) that shift optical assembly 24, as well as donor supply assembly 30, if appropriate, over the surface of the acceptor substrate. In the pictured embodiment, feed rollers 32 advance foil 26 in order to provide a fresh area of the donor film over target area 28 at each location at which a pattern is to be written. Optical assembly 24 is typically programmed and controlled to write different spatial patterns on different target areas.

System 20 may be used to print a wide range of different donor materials from foil 26 onto substrate 22. For example, the donor materials may comprise suitable metals, such as copper or aluminum, as well as alloys of these and other metals, which can be deposited on the surface of foil 26 using any suitable deposition process that is known in the art. Additionally or alternatively, the donor materials may comprise rheological materials, such as metal pastes (silver, copper or nickel, among other metals) or ceramic pastes. Further additionally or alternatively, the donor materials on film 26 may comprise metal or dielectric inks, including modified metal and dielectric inks with additives to provide controlled viscosity, as well as viscous adhesives, conductive adhesives, or other pastes, such as solder pastes. The metal pastes or inks may comprise pure metals or metal alloys. Non-conducting solids, such as polymers, oligomers or monomeric solutions, may be incorporated in the donor materials, as well.

These donor materials may be coated onto a wide variety of donor foils for use in system 20. For example, foil 26 may comprise polymeric materials such as PET, PEN, polyimide, or PEEK. Alternatively, donor foil 26 may comprise a thin, flexible glass. The foil may be smooth or structured (for example, with indentations in the foil), and may intentionally deviate from flatness, as explained further hereinbelow with reference to FIGS. 8A/B. The foil may be coated with a single layer or multiple layers, for example with a thin transparent dielectric layer, or a thin metal layer, or a combination of such layers.

System 20 may similarly be used to print on a wide range of different acceptor types. Typically, system 20 as shown in the figures is used for printing on flat acceptor substrates, such as glass, polymer foils (such as PET, PEN, polyimide, or PEEK), thermosets, or printed circuit substrates (which may be epoxy based, epoxy composites, or glass/epoxy, such as FR4). Additionally or alternatively, system 20 may be used for printing on paper, including different types of papers, with various surface treatments for applications such as packaging. The paper surface treatment may include thin coatings with organic layers. Further additionally or alternatively, system 20 may be used to print on other sorts of substrates, such as ceramic substrates, metal foils, or composites. As a further alternative, the system may be modified to print on substrates that are not flat, including curved substrates made of the some of the above-mentioned materials (molded plastics, polymeric foils, molded ceramics, etc.) Further applications of this sort of system are described in the above-mentioned U.S. Pat. No. 9,925,797.

The beam parameters of optical assembly 24 are dictated by the type of material to be printed (rheological or solid, metal or dielectric) and the donor film thickness, and are chosen so as to give the required droplet size and good printing quality. For example, when printing from a metal donor film of thickness 0.5 µm to 1 µm on donor foil 26, optical assembly 24 may typically be adjusted to give a laser pulse having a pulse duration in the nanosecond range (typically at least 0.5 ns), with a spot size of 20 µm to 30 µm on foil 26, and with pulse energy of 3 µJ to 10 µJ using a green or ultraviolet laser source. Further details of the desired laser pulse and spot size parameters are discussed with reference to the figures that follow.

Interference Detection and Compensation

Figure 2:
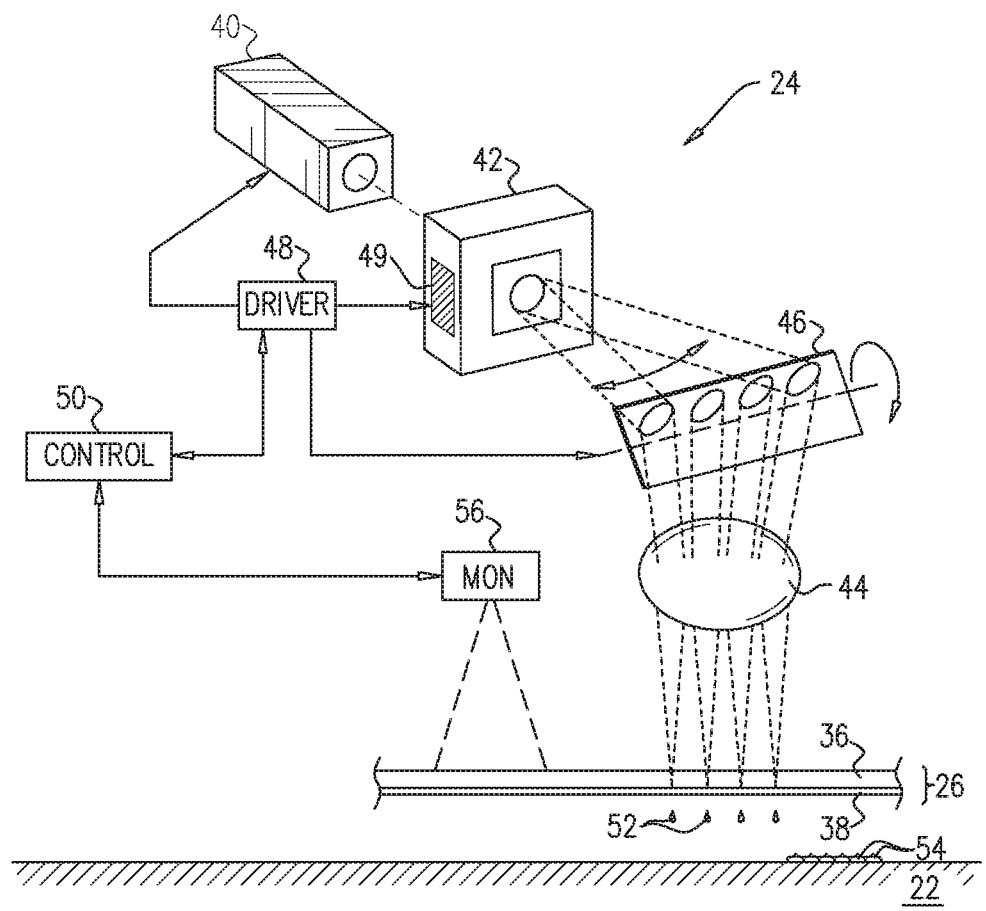
FIG. 2 is a schematic, pictorial illustration of an optical assembly used in a LIFT printing system, in accordance with an embodiment of the present invention.

FIG. 2 is a schematic, pictorial illustration showing details of optical assembly 24, in accordance with an embodiment of the present invention. A laser assembly 40 emits a pulsed beam of optical radiation, which may comprise visible, ultraviolet or infrared radiation. For example, laser assembly 40 may comprise a Nd:YAG laser, with a frequency doubler or tripler at its output, as is known in the art. Alternatively, other suitable types of lasers may be used. In some embodiments, laser assembly 40 may comprise other components, such as nonlinear optical elements for purposes of expanding the laser bandwidth (as described below with reference to FIG. 4, for example).

In the embodiment shown in FIG. 2, an acousto-optic deflector 42 splits the input beam into multiple output beams. For this purpose, a multi-frequency drive circuit 48 applies a drive signal to a piezoelectric crystal 49, which drives deflector 42 in order to generate acoustic waves in the deflector that split the input beam. Alternatively, acousto-optic deflector 42 may be driven to output and scan a single beam. Further alternatively, acousto-optic deflector 42 may be replaced by a suitable mechanical scanner, such as a rotating mirror. Drive circuit 48 typically comprises one or more analog or digital oscillators, with suitable amplification and interface circuits for generating the appropriate drive signals for the various components of optical assembly 24.

At least one scanning mirror 46 scans the beams over foil 26 via a scan lens 44. Although only a single mirror 46 is shown in FIG. 2, alternative embodiments (not shown in the figures) may employ dual-axis mirrors, which may be scanned together or independently, and/or any other suitable type of beam scanner that is known in the art.

Drive circuit 48 may drive acousto-optic deflector 42 in various different modes in order to generate the multiple output beams. A number of suitable drive techniques, along with ancillary focusing and scanning optics, that may be adapted for use in optical assembly 24 are described, for example, in the description of FIGS. 2A/B in the above-mentioned U.S. Pat. No. 9,925,797, as well as in U.S. Pat. No. 8,395,083, whose disclosure is incorporated herein by reference. In accordance with one of these techniques, drive circuit 48 generates a multi-frequency drive signal, which causes the acousto-optic deflector to diffract the input beam into multiple output beams at different, respective angles. Drive circuit 48 may also drive scanning mirror 46 and control the output of laser assembly 40.

As noted earlier, donor foil 26 comprises a transparent donor substrate 36, with a donor film 38 formed on the lower surface. Donor supply assembly 30 (FIG. 1) positions foil 26 so that donor film 38 is in proximity to target area 28 on acceptor substrate 22. Lens 44 focuses the laser pulses through the outer surface of donor substrate 36 onto donor film 38. The intense, focused laser radiation causes molten droplets 52 to be ejected from film 38 toward acceptor substrate 22. Droplets 52 land and solidify as hardened droplets 54, thus forming patterns, such as electrical traces and other structures, on the acceptor substrate.

Ideally, for precise patterning on acceptor substrate 22, the volumes of droplets 52 should be substantially uniform. The droplet volumes, however, depend strongly on the flux of the incident laser radiation that is absorbed in donor film 38. Variations in the absorbed energy will thus result in corresponding variations in droplet volume. Such variations can result, inter alia, from variations in reflection of the laser radiation across the area of donor substrate 36. More specifically, a certain fraction of the laser radiation will reflect from the upper surface of the donor substrate, and another fraction will reflect from the interface with donor film 38 on the lower surface of the donor substrate.

Figure 3:
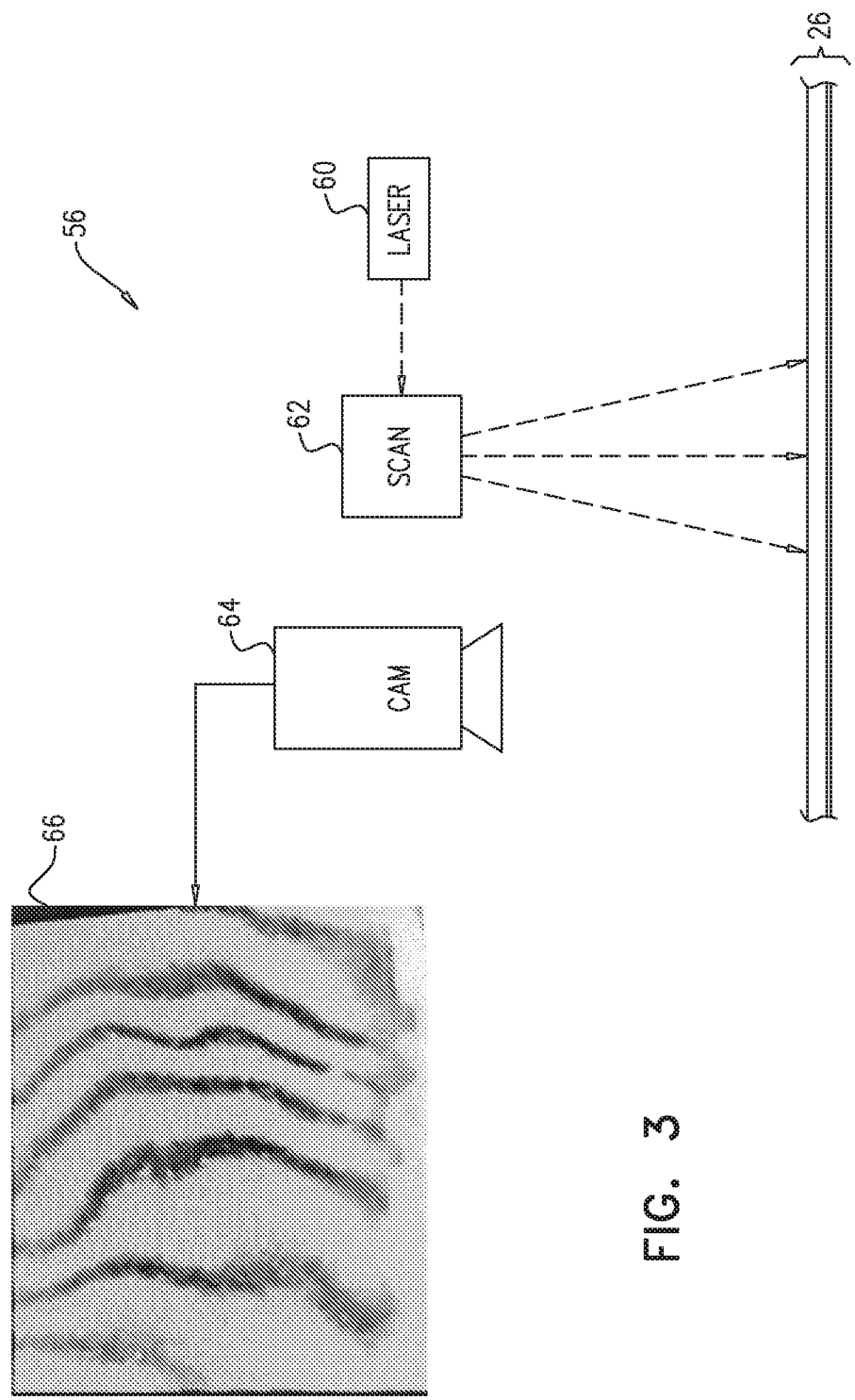
FIG. 3 is a schematic side view of a monitoring assembly that is used in a LIFT printing system, in accordance with an embodiment of the invention.

When donor substrate 36 is thin (for example, on the order of 100-200 µm thick), and the laser bandwidth is narrow, there can be substantial interference—constructive or destructive—between these reflections. The overall reflectivity of donor substrate 36 will be high where there is constructive interference and low when the interference is destructive. Small, local variations in the thickness and/or refractive index of donor substrate 36 will give rise to an interference pattern, characterized by alternating areas of high and low reflectivity. (An example of such a pattern is shown in FIG. 3.) As a consequence, the volumes of droplets 52 will vary even when the output energy of the pulses from laser assembly 40 is uniform.

To address this problem, a monitoring assembly 56 measures variations in reflection of the laser radiation across an area of donor substrate 36. For example, monitoring assembly 56 may capture an image of the interference pattern in the radiation reflected from the donor substrate. A controller 50 adjusts the intensity of the laser beam or beams (for example, by providing an appropriate input signal to drive circuit 48) based on the measured variations. The beam intensity is controlled so as to equalize the flux of the laser radiation that is absorbed in donor film 38 across the area of donor substrate 36, notwithstanding the variations in reflection. For this purpose, the laser pulse energy is increased in proportion to the measured reflectivity, so that areas of high reflectivity will receive stronger pulse energy than areas of low reflectivity. This pulse energy compensation can be accomplished, for example, by changing the driving power of laser assembly 40 or by adjusting the deflection efficiency of acousto-optic deflector 42. In this manner, the volumes of droplets 52 can be roughly equalized, as well.

For the above purposes, controller 50 typically comprises a programmable processor, together with interface circuits for receiving input signals from monitoring assembly 56 and providing output signals to drive circuit 48 and possibly other components of system 20. Controller 50 can be programmed in software to carry out the measurement and control functions that are described herein Additionally or alternatively, at least some of these functions may be carried out by hard-wired or programmable hardware logic in controller 50.

FIG. 3 is a schematic side view of monitoring assembly 56, in accordance with an embodiment of the invention. Before optical assembly writes a pattern of droplets 54 onto target area 28, monitoring assembly 56 measures the variation in the reflection of radiation at the wavelength of laser assembly 40 from the area of donor foil 26 that is going to be used in writing the pattern. For this purpose, a laser 60 emits a low-intensity beam (low by comparison with the beam that will be used in writing the pattern) at the wavelength of laser assembly 40, and a scanner 62 scans the beam over the area of the donor foil. Alternatively or additionally, scanner 62 may comprise optics (not shown) that spread the laser beam over all or a part of the area of the donor foil, so that the reflectance measurement can be made over a larger area at once. The function of laser 60 may be carried out by the same laser assembly 40 as will be used in writing the pattern, or alternatively, for increased throughput, laser 60 may be separate from laser assembly 40.

An optical sensor, such as a camera 64, measures the variation in reflection from donor foil 26 of the radiation emitted by laser 60. Camera 64 may thus generate an image 66 of the interference pattern generated due to the variations in reflection. Alternatively, a different sort of sensor may be used for this purpose, such as an optical detector whose field of view is scanned over the area of donor foil 26 together with the beam from laser 60. The area of donor foil 26 that is captured in image 66 is then aligned over target area 28 on acceptor substrate 22, and controller 50 applies the measured local variations in reflectivity, as illustrated in image 66, in adjusting the intensity of the laser radiation that is applied in writing the pattern onto the target area.

For accurate control of the laser radiation intensity, it is desirable that monitoring assembly 56 be close to target area 28, and thus capture image 66 immediately before optical assembly 24 writes the desired pattern from donor film 38 onto acceptor substrate 22. It may also be desirable to assess and compensate for changes that will occur in the interference due to heating of foil 26 by the laser beam while writing the pattern.

Interference Mitigation by Spectral Broadening

The interference between the laser radiation reflected from the upper surface and from the lower surface of donor substrate 36 varies rapidly as a function of wavelength, with a frequency that increases with thickness of the substrate. Therefore, one solution to the problem of interference, as well as to the resulting variation in absorption of the laser radiation in donor film 38, is to use a thicker donor substrate. In such a case, even with a narrowband laser source, with bandwidth of 0.2 nm, for example, the variation of interference across the laser emission band will average out so that the net effect on absorption is negligible.

For efficient operation of system 20 (FIG. 1), however, it is desirable that donor foil 26 be thin, on the order of 100-200 µm thick. In this case, using a laser beam of wavelength 532 nm and typical bandwidth of 0.2 nm or less, the inventors have found that the overall transmission of the laser radiation through donor substrate 36 can vary by as much as 40-50 k over a given target area.

In some embodiments of the present invention, this effect is mitigated by increasing the bandwidth of the laser beam. Specifically, for laser radiation in the visible range, for example at 532 nm, and foil thickness of 100-200 µm, increasing the bandwidth of the laser radiation to at least 0.8 nm is sufficient to average out the local variations of interference even from such a thin foil. This bandwidth is broader than that of typical lasers that can be used for this purpose, such as frequency-doubled Nd:YAG lasers, whose bandwidth is generally less than 0.4 nm, and is usually in the range of 0.1-0.2 nm. It is desirable, however, not to increase the laser bandwidth any more than necessary for the purpose of interference mitigation, since other components of optical assembly 24, such as acousto-optic deflector 42 and nonlinear optical elements, such as crystals used for frequency conversion, may be sensitive to the bandwidth.

Thus, in a typical implementation, using visible laser radiation and foil thickness of 100-200 μm, the laser bandwidth should be roughly in the range of 0.8-1 nm. These bandwidth requirements will vary depending on the foil thickness and laser wavelength. For ultraviolet laser radiation, a smaller bandwidth is required, whereas in the infrared, the bandwidth should be larger. For example, at 355 nm, a bandwidth of 0.4-0.5 nm should be sufficient to cancel out interference effects, but at 1064 nm, a bandwidth of 3-4 nm is needed. The desired broad bandwidth could be achieved by using a laser with very short pulse duration and/or poor mode quality; but for precise ejection of droplets 52, it is desirable that the laser pulses have a duration of at least 0.5 ns and well-controlled mode structure. Therefore, in some embodiments of the present invention, a nonlinear optical element receives an input beam generated by the laser and outputs a beam having an output bandwidth at least twice the initial bandwidth of the input beam.

Figure 4:
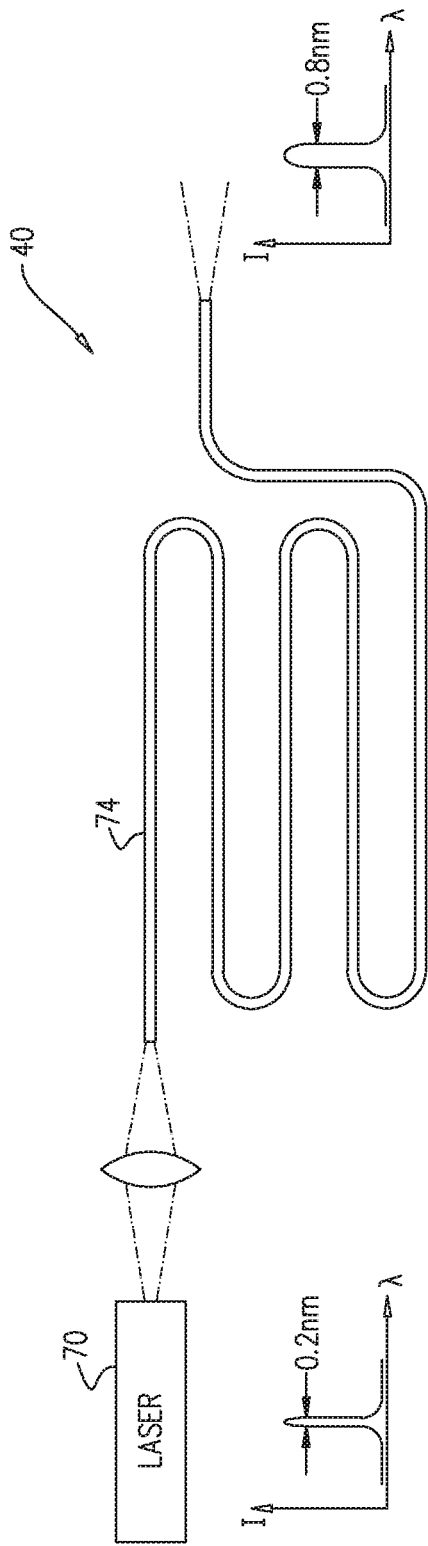
FIG. 4 is a schematic side view of a laser assembly with increased spectral bandwidth, which is used in a LIFT printing system, in accordance with an embodiment of the invention.

FIG. 4 is a schematic side view of laser assembly 40 with spectral bandwidth increased in this manner, in accordance with an embodiment of the invention. In this example, a laser 70 generates an input beam having an initial bandwidth of 0.2 nm. This beam is focused into a nonlinear optical element—in this case a suitably doped optical fiber 74, such as a fused silica fiber doped with germanium, fluorine or erbium. Self-phase modulation due to the optical Kerr effect within the fiber broadens the output bandwidth by an amount that is determined by the type and amount of doping and the length of the fiber. In the present example, these parameters are chosen so that the output bandwidth is approximately 0.8 nm.

Alternatively, if a fiber laser is used, self-phase modulation within the laser itself can be applied in a similar manner to achieve the desired bandwidth.

Further alternatively, other sorts of nonlinear optical elements may be used in order to broaden the spectral bandwidth of the laser beam. For example, the bandwidth can be increased by Brillouin scattering or frequency down-conversion, or by configuring the laser to operate in multiple longitudinal modes.

The spectral broadening of the beam in fiber 74 due to the nonlinear refractive index $n_2$ can be expressed as follows:

$$\omega(t) = \omega_0 + \alpha \cdot t$$

where $\alpha$ is:

$$\alpha = \frac{d\omega}{dt}\bigg|_0 = \frac{4\pi L n_2 L_0}{\lambda_0 \tau^2}.$$

In this expression, $\omega$ is the laser optical frequency, and t stands for time. L is the length of the fiber, $I_0$ is the pulse intensity, $\lambda_0$ is the center wavelength, and $\tau$ is the pulse duration. Assuming the laser pulse to have a Gaussian temporal profile, the spectral broadening $\Delta\lambda$ will then be given by:

$$\Delta\lambda = \frac{2\lambda_0 L n_2 I_0}{c\tau}$$

wherein c is the speed of light. Depending on the input beam parameters, the required length of fiber 74 will typically be in the range of 5 to 500 m in order to achieve the desired degree of spectral broadening.

As noted earlier, the increased bandwidth of laser assembly 40 will lead to increased dispersion in acousto-optic deflector 42, which may cause loss of scan accuracy and distortion of the laser spot across the field of the scan. To counteract these effects, optical assembly 24 may include an additional acousto-optic modulator or diffractive optical element (not shown in the figures) with dispersion opposite to that of deflector 42.

Anti-Reflection Treatment of the Donor Foil

Figure 5:
FIG. 5 is a schematic sectional view of a LIFT donor foil with anti-reflection coating, in accordance with an embodiment of the invention.

FIG. 5 is a schematic sectional view of a LIFT donor foil 80 with an anti-reflection coating 82, in accordance with an embodiment of the invention. Donor foil 80 may be used in system 20 (FIG. 1), for example, in place of foil 26.

Donor foil 80 comprises transparent donor substrate 36, as described above, with donor film 38 formed on one of its surfaces (the lower surface in FIG. 5). Donor film 38 may comprise a metal, for example, which has high reflectivity, and thus increases the fraction of the incident laser radiation that is reflected back toward the upper surface when foil 80 is irradiated in system 20. In the pictured example, anti-reflection coating 82 is formed on the opposite (upper) surface of foil 80. Typically, this anti-reflection coating comprises a thin-film layer or multiple thin-film layers, such as dielectric layers of varying refractive index, which are deposited on donor substrate 36. Alternatively, the anti-reflection coating may be formed on the lower surface of foil 80, between substrate 36 and donor film 38.

Anti-reflection coating 82 can be tailored to the specific wavelength that is output by laser assembly 40. Therefore, with a relatively small number of layers, or even a single quarter-wave layer, coating 82 should be capable of substantially reducing the amount optical energy reflected from the upper surface of donor substrate 36, and thus reducing variations in reflected intensity due to interference.

In an alternative embodiment (not shown in the figures), a birefringent donor foil can be used to suppress interference: The thickness of the birefringent foil is chosen so that it behaves as a quarter-wave plate at the wavelength of the incident beam. Consequently, when the incident laser beam is linearly polarized, the polarization of the beam reflected back from the inner surface of the foil will be rotated by 90° relative to the incident beam, and interference will thus be minimal.

Increasing the Effective Thickness of the Donor Foil

As noted earlier, increasing the thickness of donor foil 26 can substantially reduce the effect of interference for a given laser radiation bandwidth. For practical reasons, however, such as cost and foil flexibility, it is desirable that the foil be kept thin, in the range of 100-200 μm. The need for greater thickness can be addressed by using a transparent film carrier to increase the effective optical thickness of the donor foil.

Figure 6:
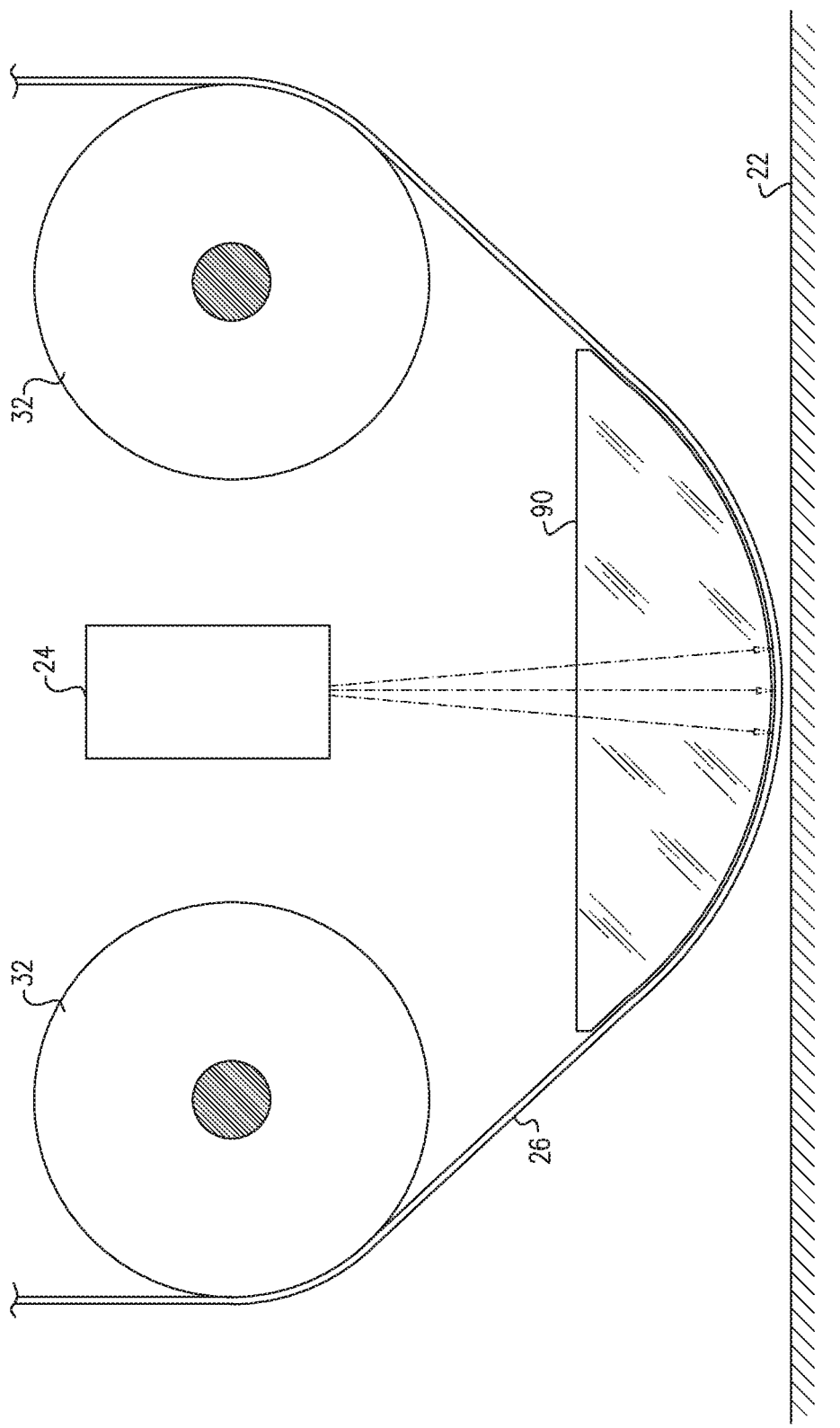
FIG. 6 is a schematic detail view of a foil carrier in a LIFT printing system, in accordance with an embodiment of the invention.

FIG. 6 is a schematic detail view of a foil carrier 90, which is used in a LIFT printing system, such as system 20, in accordance with an embodiment of the invention. Foil carrier 90 comprises a block of a transparent material, such as glass, whose lower side is positioned in proximity to the target area on acceptor substrate 22. Donor supply assembly 30 (FIG. 1) positions and advances donor foil 26 along this lower side, so that the upper surface of the donor substrate is in contact with the lower side of film carrier 90, and the donor film is in proximity to the target area on the acceptor substrate. Optical assembly 24 directs the beam or beams of laser radiation through the upper side of foil carrier 90, so that the beam or beams pass through the foil carrier and the donor substrate, and thus impinge on the donor film.

To achieve the desired effective thickening of the donor foil, it is important that the refractive indices of film carrier 90 and donor substrate 36 be closely matched at the wavelength of the laser radiation. For this purpose, the transparent materials used in the film carrier and donor substrate can desirably be chosen so that their respective refractive indices differ by no more than 10%, or even less, at the radiation wavelength. Additionally or alternatively, an index-matching, anti-reflection layer may be formed on either the lower side of film carrier 90 or the upper surface of foil 26, or both.

It is also desirable that the lower side of foil carrier 90 have a convex shape, such as a cylindrical curve, as shown in FIG. 6. This sort of shape is useful both in maintaining close contact between carrier 90 and foil 26, and in preventing distortion of the optical phase front of the laser beam. In this regard, it is desirable that the gap between carrier 90 and foil 26 be substantially smaller than the laser wavelength, for example no more than several tens of nanometers. A liquid or gel may be introduced between the carrier and the foil for the purpose of refractive index matching.

Reducing Interference Using Oblique Incidence

As explained earlier, the pattern of varying reflectivity that gives rise to local differences in the laser beam energy that is absorbed in donor film 38 is due to interference between reflections of the laser beam from the upper and lower surfaces of donor substrate 36. This problem can be alleviated if the two reflections (from the upper surface and the lower surface) are displaced transversely relative to one another: If there is little or no overlap between the reflected beams, then there will be little or no interference.

This sort of transverse displacement can be achieved if the beam or beams of laser energy are incident on at least one of the surfaces of donor substrate 36 at an oblique angle, i.e., an angle that deviates from a normal to the plane of the donor film. The desired oblique incidence can be achieved either by directing the laser beam at an oblique angle or by fabricating the donor film so that one or both of its surfaces are not flat.

Figure 7A:
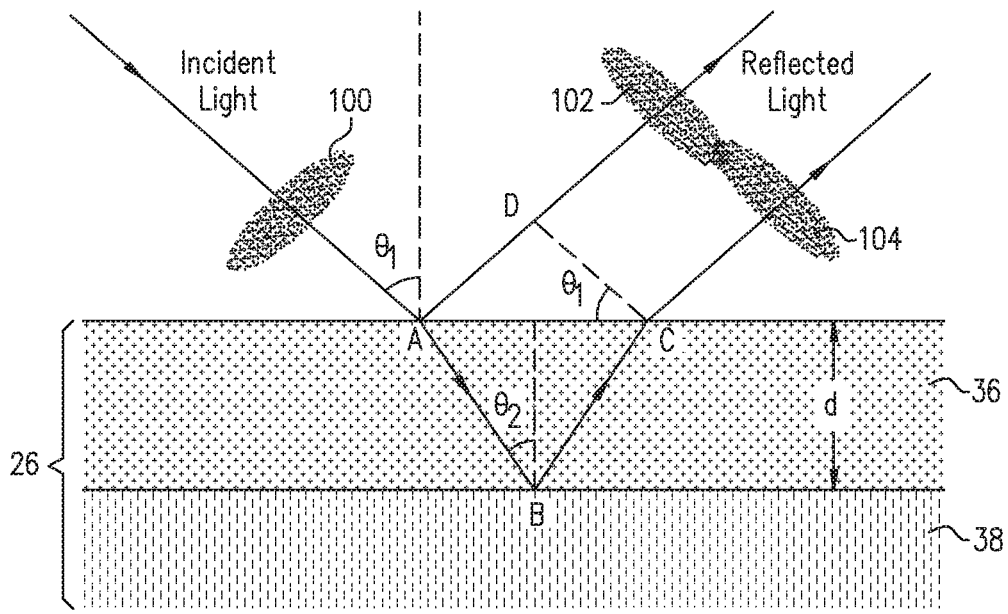
FIG. 7A is a schematic detail view of a LIFT donor foil on which a laser beam is incident at an oblique angle, in accordance with an embodiment of the invention.

FIG. 7A is a schematic detail view of LIFT donor foil 26 on which a laser beam is incident at an oblique angle $\theta_1$, in accordance with an embodiment of the invention. In this embodiment (as in the preceding embodiments), the upper and lower surfaces of donor substrate 36 are assumed to be mutually parallel, with a thickness d between the surfaces. Donor film 38 is coated on the lower surface of donor substrate 36, parallel to the target area on acceptor substrate 22.

In the present embodiment, optical assembly 24 (FIG. 1) directs the beam of laser radiation to pass through donor substrate 36 and impinge on donor film 38 as in the preceding embodiments, except that in this case the laser beam is incident at the oblique angle $\theta_1$. As will be shown below, for typical thicknesses of donor substrate 36 and typical sizes of an incident laser spot 100, setting $\theta_1$ to be at least 5° is sufficient to avoid overlap between reflected beam spots 102 and 104, and thus prevent interference.

With reference to FIG. 7A, let d be the thickness of substrate 36, with refractive index n. The relation between the input angle $\theta_1$ needed for negligible overlap and the spot size w will then be as follows:

$$\theta_2 = \sin^{-1}(\sin\theta_1/n)$$

$$AC = w/\cos\theta_1 (2_b) AC = d\cdot\tan(\theta_2)$$

$$w = 2\cdot d\cdot\tan(\theta_2)\cdot\cos\theta_1$$

Figure 7B:
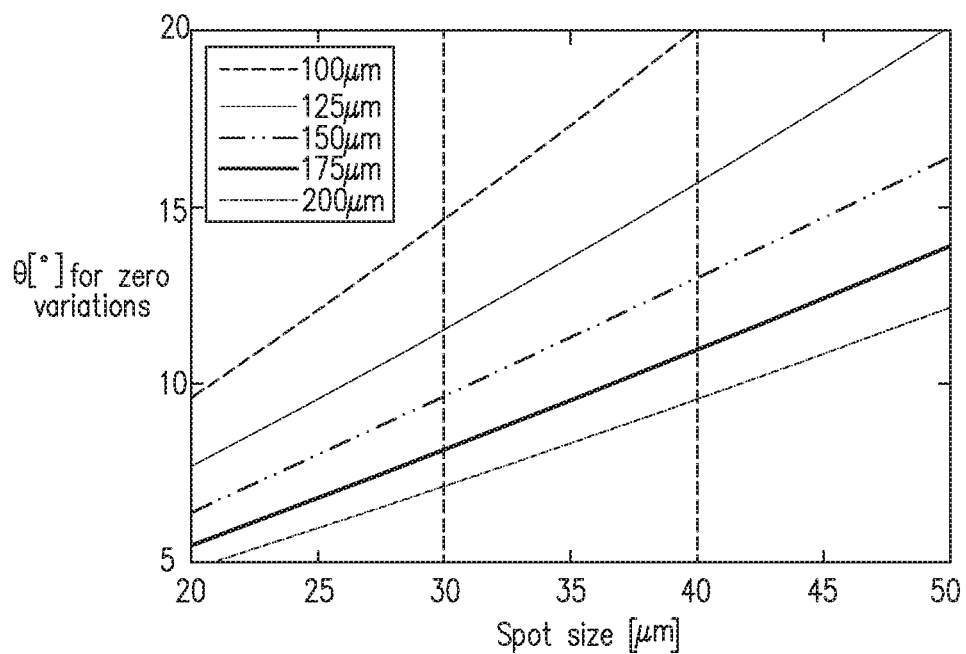
FIGS. 7B and 7C are plots that schematically show angles of incidence of a laser beam on a donor substrate to be set as a function of laser spot size in order to avoid interference effects, in accordance with an embodiment of the invention.

FIG. 7B is a plot that schematically shows angles of incidence of a laser beam on donor foil 26, to be set as a function of the size (diameter) of incident laser spot 100 in order to avoid interference effects between the reflected beams, in accordance with an embodiment of the invention. The plot shows the minimum value of the angle of incidence $\theta_1$ that will result in no overlap between reflected beam spots 102 and 104 for a range of different substrate thicknesses d, from 100 μm up through 200 μm. Although the calculation assumes spots 102 and 104 to have sharp edges, the results can be applied approximately to Gaussian beams of comparable 1/e diameters, since the amount of energy outside these diameters is small.

It can be seen in the plot that for a small laser spot size (20 μm) and relatively thick foils, setting $\theta_1 = 5°$ will substantially eliminate any interference between the reflected beams. The required angle increases to 10° for a thinner film, with d=100 μm, and may be even greater if the laser spot size is larger.

Figure 7C:
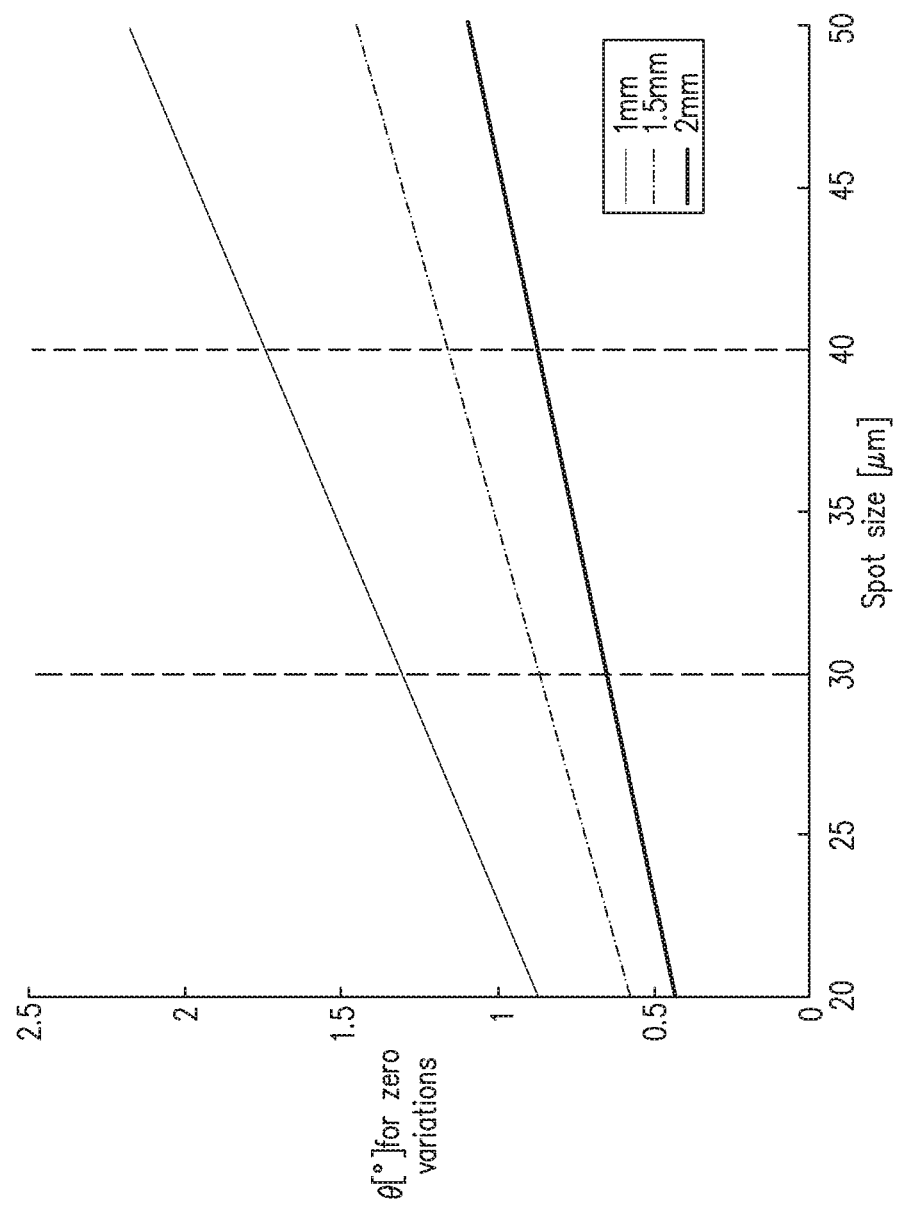

FIG. 7C is a plot that schematically shows angles of incidence of a laser beam on thicker donor substrates, to be set as a function of the size (diameter) of incident laser spot 100 in order to avoid interference effects between the reflected beams, in accordance with another embodiment of the invention. In this case, the plot shows the minimum value of the angle of incidence $\theta_1$ that will result in no overlap between reflected beam spots 102 and 104 for a range of different substrate thicknesses d, from 1-2 mm. The plot shows that for substrates in this thickness range, an angle of incidence of 2-3° is sufficient to avoid interference effects even with relatively large laser beam diameters.

Various optical configurations can be used to generate the oblique beams used in the embodiments of FIGS. 7A-C, for example by appropriate design and configuration of scan lens 44 (FIG. 2). In order to scan a large field of view at the large angles of incidence required for thin donor films, such as $\theta_1 = 5°$, scan lens 44 may comprise a non-telecentric f-theta lens, which is aligned to that the laser beam enters the lens far from the optical axis of the lens. For smaller fields of view and smaller angles of incidence, other sorts of scan lenses may be used, with the laser beam only slightly off axis.

When using an oblique beam in LIFT printing, any change in the height of donor foil 26 will translate into a transverse shift in the laser spot position on donor film 38, and as a result, a transverse shift in the location of the droplet that is ejected toward acceptor substrate 22. To maintain good printing accuracy under these conditions, wheels 32 (FIG. 1) should be designed precisely to minimize any static spatial differences in foil height. Additionally or alternatively, vacuum or forced air may be applied to keep foil 26 flat at the desired distance from target area 28. Further additionally or alternatively, monitoring assembly 56 (FIG. 2) can be configured to monitor variations in the height of foil 26, and controller 50 can then control drive circuit 48 so that modulator 42 and/or scanning mirror 46 compensates for small height variations.

Reducing Interference Using Uneven Donor Surfaces

Figure 8A:
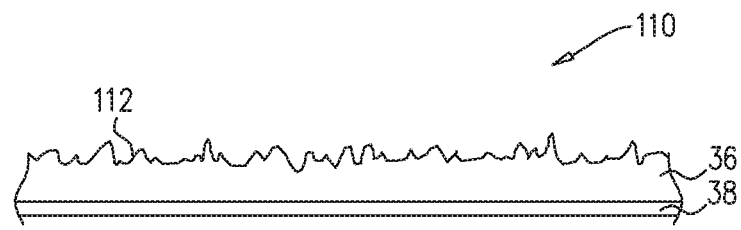
FIGS. 8A and 8B are schematic sectional views of donor foils with uneven surfaces, in accordance with further embodiments of the invention.
Figure 8B:
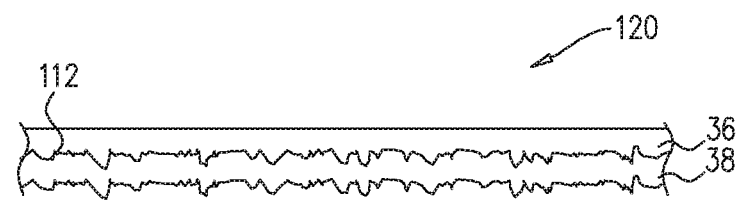

FIGS. 8A and 8B are schematic sectional views of donor foils 110 and 120, respectively, with uneven surfaces, in accordance with another embodiment of the invention. Foils 110 and 120 can be used in system 20, for example, in place of foil 26. In foil 110, an outer surface 112 of donor substrate 36 is uneven, whereas in foil 120, an inner surface 122 of donor substrate is uneven (and consequently, so is donor film 38). The surfaces are "uneven" in the sense that they deviate substantially from flatness. The scale of the uneven surface in these figures is arbitrary and is shown solely by way of illustration.

Because surfaces 112 and 122 are uneven, the beam or beams of laser radiation in system 20 will be incident on these surfaces at angles that are locally oblique. The profiles of surfaces 112 and 122 are chosen with obliqueness sufficient to prevent any substantial overlap between the beams reflected from the upper and lower surfaces of donor substrate 36. Any suitable profile that satisfies this criterion can be used, such as a sawtooth profile or a pseudo-random profile. In one embodiment, the surface profiles are chosen so that the thickness of donor substrate 36 varies by at least 10% over any given sector having transverse dimensions of at least 1 mm.

In some embodiments, the uneven surface 112 or 122 is formed by roughening the surface in question. This roughening reduces the intensity of the interfering part of the reflected laser radiation, by a degree that depends on the level of scattering from the rough surface. It can be beneficial to roughen inner surface 122, since in this case the optical distortion of the incident laser beam will be minimal. The roughening characteristics (such as the size and depth of the pattern of roughening) should be chosen so that at least 50% of the radiation that is reflected from the roughened surface is scattered into angles greater than 5° relative to a normal to the surface, and thus will not interfere with the radiation that is specularly reflected from the other surface of the substrate.

The type and degree of roughening of inner surface 122 are chosen so as to cause sufficient scattering in order to reduce the interference effect without compromising the ejection of material from donor film 38. To avoid uneven deposition and ejection of the donor material, it is desirable that the lateral roughness scale of surface 122 be much smaller than the laser spot size, for example less than half the laser spot diameter, which is typically 20-50 µm in the embodiments described above. The scattering intensity can be estimated based on the wavelength $\lambda$, the RMS (root mean square) roughness $\sigma$ of the scattering surface and the autocorrelation length $\Lambda$ (representing the lateral variation of the roughness). For example, with $\sigma$=100 nm, $\Lambda$=2 µm, and $\lambda$=532 nm, roughly 64% of the incident light that is reflected from surface 122 is scattered away to angles larger than 5° from the normal, meaning that the effect of interference will be reduced by at least 64%. At the same time, because the autocorrelation length $\Lambda$ is much smaller than the laser spot size, and the roughness is much smaller than the thickness of donor film 38 (for example, less than half the donor film thickness), roughening of surface 122 will have no significant effect on the uniformity of ejection of the donor material.

Figure 9A:
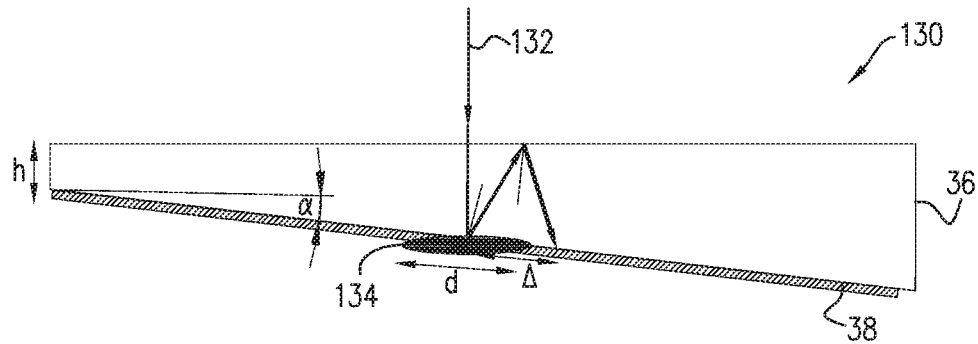
FIGS. 9A, 9B and 9C are schematic sectional views of wedged donor substrates on which laser beams are incident at different angles, in accordance with further embodiments of the invention.
Figure 9B:
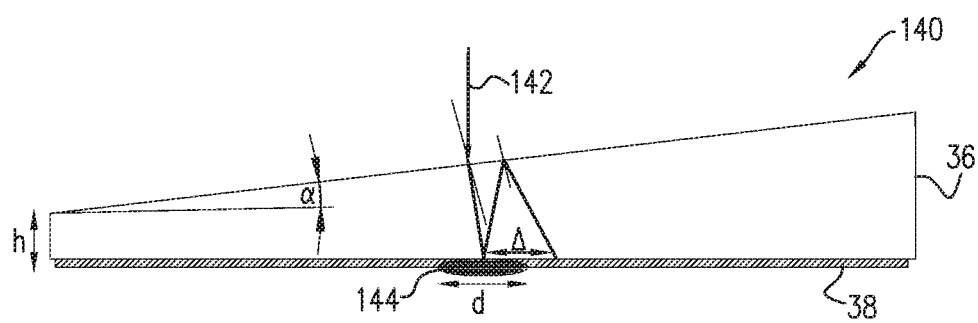
Figure 9C:
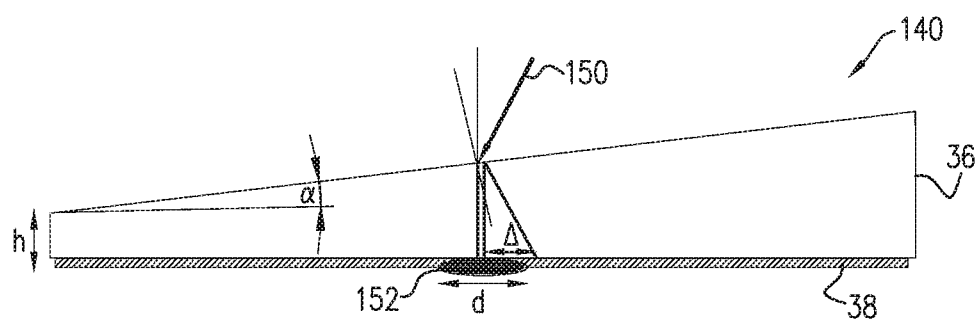

FIGS. 9A, 9B and 9C are schematic sectional views of donor foils 130, 140 in which donor substrate 36 is wedged, in accordance with embodiments of the invention. Laser beams 132, 142 and 150 are incident on substrate 36 at different angles in these three embodiments.

A wedged donor substrate with a wedge angle $\alpha$ can serve to deflect the incident laser beam and avoid interference due to multiple reflections, provided the lateral shift $\Delta$ of the beam after a round trip is larger than the laser spot size d. In the example shown in FIG. 9A, the shift due to the wedge angle is given by:

$$\Delta = 2h\frac{\sin(2\alpha)}{\cos(3\alpha)}$$

For a spot 134 of diameter d, the criterion to avoid interference is that $\Delta$>d. For small angles $\alpha$, the above formula can be approximated as $\Delta \sim 4\alpha h$, and the condition to avoid interference is:

$$\alpha > \frac{d}{4h}$$

wherein h is the thickness of substrate 36 at its thinner edge.

Assuming donor foil 130 to have a width W (the dimension of the foil in the Y-direction in FIG. 1), the minimal wedge angle that will satisfy the above criterion will be:

$$\alpha > \sqrt{\frac{d}{4W}}$$

For example, for a spot size d=30 µm and W=25 mm, a wedge angle $\alpha$ of about 1° will be sufficient to satisfy the above condition, meaning that the average thickness of foil 130 is about 0.5 mm.

For the wedge configuration of foil 140, with beam 142 creating a spot 144 as shown in FIG. 9B, the following condition defines the minimum wedge angle that is required to avoid interference:

$$\alpha > \frac{n}{2n+1}\frac{d}{2h}$$

wherein n is the index of refraction of the substrate.

The choice between foils 130 and 140 depends on system considerations, such as the desired distance between and orientations of the donor and acceptor in the LIFT system. For example, in the configuration of FIG. 9A, the lower surface of donor substrate 36 may be tilted relative to the acceptor substrate, whereas in the configuration of FIG. 9A, the lower surface of the donor substrate is parallel to the acceptor substrate. Furthermore, in the configuration of FIG. 9B, beam 142 is deflected due to refraction, giving a displacement in the Y-direction that varies over the width of foil 140. This displacement should be taken into consideration in the print plan.

The embodiment of FIG. 9C avoids this displacement by orienting beam 150 at an angle $n\alpha$ relative to the normal of the upper surface of foil 140. As a result of refraction, beam 150 propagates within substrate in a direction perpendicular to the lower surface, thus creating a spot 152 on donor film 38 that is directly below the point of incidence on the upper surface. For this case, the minimum wedge angle is given by:

$$\alpha > \frac{d}{2h}$$

Although the figures and description provided above present a number of different solutions that may each be applied individually to the problem of interference and varying reflectivity of the donor sheets, two or more of these solutions may alternatively be applied in combination, in order to achieve further mitigation of the problem. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A printing apparatus, comprising:
a donor supply assembly, which is configured to position a transparent donor substrate having opposing first and second surfaces and a donor film formed on the second surface so that the donor film is in proximity to a target area on an acceptor substrate;
an optical assembly, which is configured to direct one or more beams of laser radiation to pass through the first surface of the donor substrate and impinge on the donor film so as to induce ejection of material from the donor film onto the acceptor substrate;
a monitoring assembly, which is configured to measure a variation in reflection of the laser radiation across an area of the donor substrate; and
a controller, which is configured to adjust an intensity of the laser radiation responsively to the measured variation so as to equalize a flux of the laser radiation that is absorbed in the donor film across the area of the donor substrate.

2. The apparatus according to claim 1, wherein the monitoring assembly is configured to capture an image of an interference pattern formed by the laser radiation, wherein the interference pattern is indicative of the variation in the reflection.

3. The apparatus according to claim 1, wherein the donor film comprises a metal and the donor substrate has a thickness between the first and second surfaces that is no greater than 200 μm.

4. The apparatus according to claim 1, wherein the donor substrate is comprised in a continuous flexible foil, and wherein the donor supply assembly comprises feed rollers, which are configured to feed the foil across the target area.

5. The apparatus according to claim 4, wherein the donor supply assembly is configured to successively position different donor areas of the foil in proximity to the acceptor substrate, and
wherein the monitoring assembly is configured to measure the variation of the reflection respectively in each of the donor areas, and the controller is configured to adjust the intensity of the laser radiation impinging on each of the donor areas responsively to the respectively measured variation.

6. A printing apparatus, comprising:
a donor supply assembly, which is configured to position a transparent donor substrate having opposing first and second surfaces and a thickness between the first and second surfaces no greater than 200 μm, and having a donor film formed on the second surface so that the donor film is in proximity to a target area on an acceptor substrate; and
an optical assembly, which is configured to direct one or more beams of pulsed visible laser radiation, having a bandwidth of at least 0.8 nm, to pass through the first surface of the donor substrate and impinge on the donor film so as to induce ejection of material from the donor film onto the acceptor substrate.

7. The apparatus according to claim 6, wherein the pulsed laser radiation comprises pulses having a pulse duration of at least 0.5 ns.

8. The apparatus according to claim 6, wherein the bandwidth of the visible laser radiation directed to pass through the first surface of the donor substrate is no greater than 1.0 nm.

9. The apparatus according to claim 6, wherein the optical assembly comprises:
a laser, which generates an input beam of the laser radiation having an initial bandwidth less than 0.4 nm; and
a nonlinear optical element, which is configured to receive and broaden the bandwidth of the input beam to at least 0.8 nm.

10. The apparatus according to claim 9, wherein the nonlinear optical element is configured to broaden the bandwidth using the optical Kerr effect.

11. The apparatus according to claim 6, wherein the donor film comprises a metal.

12. The apparatus according to claim 6, wherein the donor substrate is comprised in a continuous flexible foil, and wherein the donor supply assembly comprises feed rollers, which are configured to feed the foil across the target area.

13. A printing apparatus, comprising:
a donor supply assembly, which is configured to position a transparent donor substrate having opposing first and second surfaces and a donor film formed on the second surface so that the donor film is in proximity to a target area on an acceptor substrate; and
an optical assembly, which comprises:
a laser, which generates an input beam of laser radiation having an initial bandwidth;
a nonlinear optical element, which is configured to receive the input beam and generate an output beam having an output bandwidth at least twice the initial bandwidth;
optics configured to direct the output beam to pass through the first surface of the donor substrate and impinge on the donor film so as to induce ejection of material from the donor film onto the acceptor substrate;
a monitoring assembly, which is configured to measure a variation in reflection of the laser radiation across an area of the donor substrate; and
a controller, which is configured to adjust an intensity of the laser radiation responsively to the measured variation so as to equalize a flux of the laser radiation that is absorbed in the donor film across the area of the donor substrate.

14. The apparatus according to claim 13, wherein the nonlinear optical element is configured to broaden the bandwidth using the optical Kerr effect.

15. The apparatus according to claim 13, wherein the donor film comprises a metal.

16. The apparatus according to claim 13, wherein the donor substrate is comprised in a continuous flexible foil, and wherein the donor supply assembly comprises feed rollers, which are configured to feed the foil across the target area.

17. A printing apparatus, comprising:
a donor supply assembly, which is configured to position a transparent donor substrate having opposing, mutually-parallel first and second surfaces and a thickness between the first and second surfaces no greater than 200 µm, and having a donor film formed on the second surface with the donor film in proximity and parallel to a target area on an acceptor substrate; and
an optical assembly, which is configured to direct one or more beams of pulsed visible laser radiation having a bandwidth of at least 0.8 nm to pass through the first surface of the donor substrate at an angle that deviates from a normal to the first surface by at least 1°, and to impinge on the donor film so as to induce ejection of material from the donor film onto the acceptor substrate.

18. The apparatus according to claim 17, wherein the donor film comprises a metal.

19. The apparatus according to claim 17, wherein the optical assembly is configured so that the angle at which the one or more beams of laser radiation pass through the first surface of the donor substrate deviates from the normal to the first surface by at least 5°.

20. The apparatus according to claim 19, wherein the optical assembly is configurable so that the angle at which the one or more beams of laser radiation pass through the first surface of the donor substrate deviates from the normal to the first surface by 10°.

21. The apparatus according to claim 19, wherein the donor substrate has a thickness between the first and second surfaces that is no greater than 200 µm.

22. The apparatus according to claim 19, wherein the donor substrate is comprised in a continuous flexible foil, and wherein the donor supply assembly comprises feed rollers, which are configured to feed the foil across the target area.

23. The apparatus according to claim 17, wherein the optical assembly comprises a lens having an optical axis, and the one or more beams of laser radiation are incident on the lens off the optical axis, thereby causing the one or more beams to deviate from a normal to the first surface.

* * * * *

UNITED STATES PATENT AND TRADEMARK OFFICE
CERTIFICATE OF CORRECTION

| | | |
|---|---|---|
| PATENT NO. | : 12,162,294 B2 | Page 1 of 1 |
| APPLICATION NO. | : 17/427372 | |
| DATED | : December 10, 2024 | |
| INVENTOR(S) | : Altman et al. | |

It is certified that error appears in the above-identified patent and that said Letters Patent is hereby corrected as shown below:

On the Title Page

Item (54) and in the Specification, Column 1, Line 1, should read:
-- BANDWIDTHS AND EQUALIZED FLUX FOR LIFT PRINTING USING THIN DONOR FOILS
--

Signed and Sealed this
Twenty-second Day of April, 2025

Coke Morgan Stewart
*Acting Director of the United States Patent and Trademark Office*